United States Patent [19]
Keller

[11] 4,001,724
[45] Jan. 4, 1977

[54] VARIABLE HIGH FREQUENCY CRYSTAL OSCILLATOR

[75] Inventor: Anthony F. Keller, Chicago, Ill.

[73] Assignee: Motorola, Inc., Schaumburg, Ill.

[22] Filed: June 25, 1975

[21] Appl. No.: 590,245

[52] U.S. Cl. .................. 331/116 R; 331/177 V; 332/26; 332/30 V
[51] Int. Cl.² .................. H03B 5/36; H03C 3/22
[58] Field of Search ............ 331/116 R, 158, 159, 331/164, 177 V; 332/26, 30 V

[56] References Cited

UNITED STATES PATENTS

| | | | |
|---|---|---|---|
| 3,569,865 | 3/1971 | Healy | 331/116 R |
| 3,845,410 | 10/1974 | Steel | 331/116 R |

Primary Examiner—Siegfried H. Grimm
Attorney, Agent, or Firm—James W. Gillman; Eugene A. Parsons

[57] ABSTRACT

A Colpitts type oscillator having a tank circuit including a crystal, a voltage variable capacitor and split capacitors with a first inductance including a coil connected in series with the crystal and a second inductance including a coil connected in parallel with the series connected coil and crystal and a second coil connected in series with one of the capacitors and the series combination connected in parallel with the first coil of the second inductance, said first and second inductances operating to neutralize the $C_o$ of the crystal, providing an impedance transformation between the crystal and the tank circuit, and improving the stability of the oscillator over a substantially increased warp range.

10 Claims, 8 Drawing Figures

VARIABLE HIGH FREQUENCY CRYSTAL OSCILLATOR

BACKGROUND OF THE INVENTION

1. Field of the Invention

The present invention pertains to variable oscillators and, in particular, to oscillators operating at relatively high frequencies, such as Colpitts oscillators and the like. Normally, to vary the operating frequency of a crystal oscillator, a variable impedance is connected into the tank circuit. The warp range or operating range, of the oscillator is determined by the amount that this impedance in the tank circuit can be varied. At present, it is common to use a voltage variable capacitor or the like for the variable impedance in the tank circuit so that the frequency of the oscillator can be controlled by a remotely generated voltage. However, the range of voltage variable capacitors is severely limited and, therefore, it is difficult to obtain the desired warp range for the oscillator by using a voltage variable capacitor.

Further, once a relatively wide warp range is obtained in a crystal oscillator, difficulties arise because a crystal has a tendency to be non-linear when utilized over a relatively wide range of frequencies. This non-linearity is caused by the physical capacitance, $C_o$, of the crystal and can be improved by neutralizing the $C_o$ of the crystal.

A second problem which arises when a crystal oscillator is warped or varied over a wide frequency range is the tendency of the oscillator to oscillate at spurious modes. This tendency to operate at spurious modes, or instability of the oscillator, greatly reduces the usable range of the oscillator. This is especially true for high frequency oscillators.

2. Description of the Prior Art

In the prior art, attempts have been made to improve the linearity of the overall oscillator by neutralizing the $C_o$ of the crystal by placing inductances in parallel therewith. In some instances, such as in U.S. Pat. No. 3,571,754, entitled "Wide Deviation Voltage Controlled Crystal Oscillator", issued Mar. 23, 1971, attempts have been made to incorporate the neutralization coils into a Norton impedance transforming network to increase the deviation range of a crystal oscillator. However, a relatively low frequency type of crystal oscillator is utilized and the difficulties of high frequency operation and instability of the oscillator were not considered or encountered.

SUMMARY OF THE INVENTION

The present invention pertains to a variable high frequency crystal oscillator including an oscillator having an electronic tank circuit with a crystal and impedance generating means therein for varying the frequency of oscillation with first and second inductance means coupled into the tank circuit for neutralizing the physical capacitance, $C_o$, of the crystal, for providing an impedance transformation between the crystal and the tank circuit operating as a load on the crystal, and for increasing the stability of the oscillator over a wide range of oscillations. In the preferred embodiment, the first and second inductance means include a first coil connected in series with the crystal, a second coil connected in parallel with the first coil and the crystal, and a third coil connected in series with one split capacitor of a Colpitts oscillator and the series combination connected in parallel with the second coil, or a spurious mode damping resistor in series with the second coil (in lieu of the third coil).

It is an object of the present invention to provide an improved variable, high frequency crystal oscillator.

It is a further object of the present invention to provide an oscillator including components for neutralizing the physical capacitance, $C_o$ of the crystal to improve the linearity of the crystal, for providing an impedance transformation between the crystal and the tank circuit operating as a load on the crystal to increase the deviation range of the oscillator, and for improving the stability of the oscillator over the increased deviation range.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
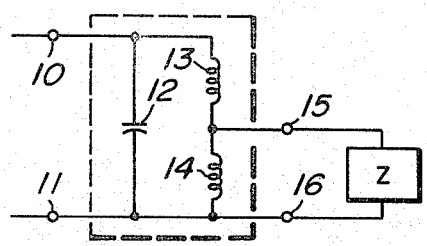
FIG. 1 is a schematic diagram of an impedance transforming network.

Referring specifically to FIGS. 1–4, an impedance transforming network is illustrated having a pair of input terminals 10 and 11 with a capacitor 12 connected therebetween. A first inductance, which in this embodiment is a single coil 13, is connected in series with the capacitor 12 and a second inductance, which in this embodiment is a single coil 14, is connected in parallel with the series combination of the capacitor 12 and the coil 13. A pair of output terminals 15 and 16 are connected on each side of the coil 14, respectively. The impedance looking into the input terminals 10 and 11 is designated X and the impedance looking out of the output terminals 15 and 16 is designated Z, and it can be shown that the ratio of changes in the input impedance to changes in the output impedance is in accordance with the following formula:

$$\frac{\Delta X}{\Delta Z} = \left(\frac{L_{13} + L_{14}}{L_{14}}\right)^2$$

This formula can be derived using standard well known techniques, but the derivation will not be explained in detail herein.

Figure 2:
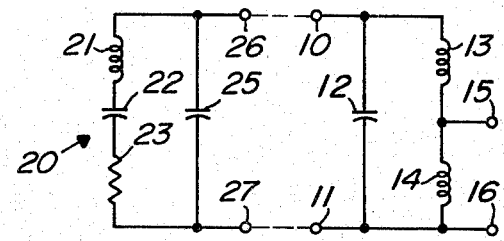
FIG. 2 is a schematic diagram of an equivalent circuit of a crystal and the impedance transforming network of FIG. 1.
Figure 3:
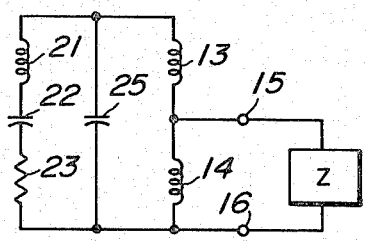
FIG. 3 is a schematic diagram of the combination of the equivalent circuit and impedance transforming network of FIG. 2.

The equivalent circuit of a crystal, generally designated 20, is illustrated in FIG. 2. The crystal includes a motional inductance 21, a motional capacitance 22 and a small resistance 23 in series with a capacitance 25, which is the $C_o$ or physical capacitance between the electrodes of the crystal 20, in parallel with the series branch. The crystal 20 has a pair of output terminals 26 and 27 which are connected on each side of the capacitor 25, respectively. By connecting the output terminals 26 and 27 of the crystal 20 to the input terminals 10 and 11 of the impedance transforming network the capacitors 25 and 12 are in parallel and can be combined or represented by a single capacitor, as illustrated in FIG. 3.

The frequency versus reactance relationship of a crystal is a measure of its sensitivity and this sensitivity must be relatively constant for most applications, i.e. crystal oscillators and the like. Crystals generally exhibit a high degree of non-linearity, which can be greatly improved by cancelling the $C_o$ thereof. The $C_o$ of a crystal can be cancelled by placing a properly selected inductor, $L_o$, in parallel therewith. The following formula then applies:

$$(W_r)^2 = \frac{1}{C_o L_o}$$

Figure 4:
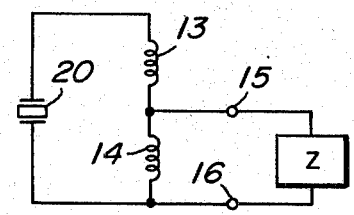
FIG. 4 is a schematic diagram illustrating an embodiment of the neutralizing and impedance transforming network combined with a crystal.
Figure 5:
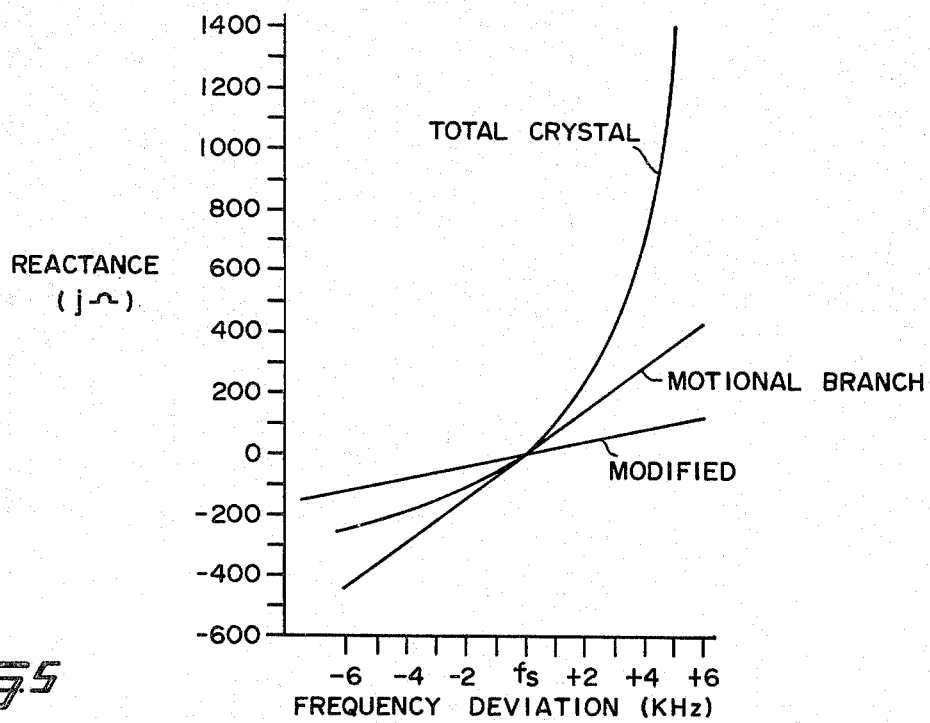
FIG. 5 is a graphic representation of the frequency deviation of the crystal versus reactance change of the circuit with and without neutralization and impedance transformation.

The crystal sensitivity then is extremely linear and equal to:

$$\text{Sens.} = \frac{\Delta F}{\Delta X} = \frac{1}{4\pi L_m}$$

Where $L_m$ is the motional inductance of the crystal. The non-linearity of a crystal prior to neutralization of $C_o$ is illustrated graphically in FIG. 5 by the curve labeled "total crystal" and the improved sensitivity or linearity of the crystal is graphically represented by the curve labeled "motional branch". Thus, the impedance transforming network in FIGS. 1-4 can be chosen so that the $C_o$, capacitance 25, of the crystal 20 simply replaces the capacitance 12 in the network. Further, the inductance of the coils 13 and 14 can be chosen so that the $C_o$, capacitor 25, is neutralized as described above. Thus, the total neutralizing and impedance transforming circuit would be reduced to the two coils 13 and 14 connected as illustrated in FIG. 4. With the two coils 13 and 14 neutralizing the $C_o$ of the crystal 20 and providing impedance transformation between the crystal and the output terminals 15 and 16, the frequency deviation versus reactance curve of the crystal 20 is adjusted to the curve labeled "modified". It will be noted, by referring to FIG. 5, that a 1 kHz deviation of the frequency of the crystal not having the impedance transforming network connected thereto (but with $C_o$ neutralized) requires approximately a 75 ohm reactance change. However, with the 4:1 impedance transformation network connected to the crystal a 1 kHz change in frequency is obtained with a 19 ohm change in reactance. In an oscillator where a frequency deviation of, for example, plus or minus 3 kHz may be desired, this reduces the required reactance change from plus or minus 225 ohms to plus or minus 57 ohms. When a high frequency oscillator, i.e. 50 megahertz, is being utilized a 225 ohm impedance change is extremely difficult but a 57 ohm reactance change is practical.

Figure 6:
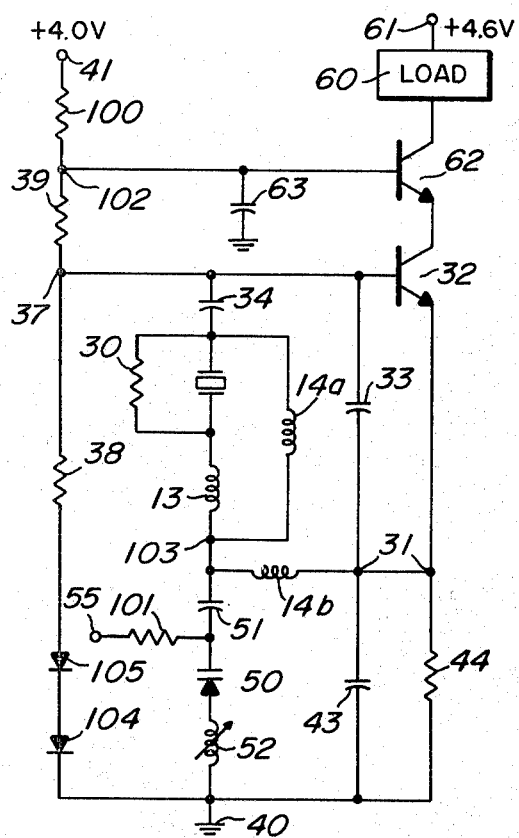
FIG. 6 is a schematic diagram of a high frequency oscillator embodying the present invention.

Referring to FIG. 6, a high frequency crystal oscillator is illustrated wherein neutralizing and impedance transforming inductances are connected to the crystal as described above. For convenience in applying the above formulas and description to the schematic of FIG. 6, similar numbers will be used to designate similar components. The crystal 20 is connected in series with the single coil 13 of the first inductance and a resistor 30 is connected in parallel with the crystal 20. In this embodiment the second inductance includes a first coil 14a and a second coil 14b. The coil 14a is connected in parallel with the series combination of the crystal 20 and the coil 13. One end of the second coil 14b is connected to a junction 103 of the coils 13 and 14a and the other end of the coil is connected to a junction 31. The junction 31 is connected directly to the emitter of an npn type transistor 32 and through a capacitor 33 to the base of the transistor 32. The base of the transistor 32 is also connected through a small DC blocking capacitor 34 to the junction of the crystal 20 and the coil 14a, and to a bias junction 37. Junction 37 is connected through the series combination of a resistor 38 and a pair of diodes 104 and 105 to ground 40. Junction 37 is further connected through a resistor 100 to a terminal 41 adapted to have a positive voltage (in this embodiment plus 4 volts) applied thereto. A capacitor 43 and resistor 44 are connected in parallel between the terminal 31 and ground 40. The capacitors 33 and 43 form split capacitors for a Colpitts type oscillator. An impedance generator, which in this embodiment is a voltage variable capacitor 50, is connected in series with a capacitor 51 and a variable coil 52 between ground 40 and the junction 103 to complete the oscillator circuit. While no specific circuitry is illustrated for varying the voltage across the voltage variable capacitor 50 to change the frequency of the oscillator, it should be understood that any convenient modulating circuit might be attached thereto as, for example, between a terminal 55 and ground. Terminal 55 is connected through a resistor 101 to a junction between capacitor 51 and the voltage variable capacitor 50. The output of the oscillator is applied to a load 60, which is connected between a terminal 61 adapted to have a positive voltage applied thereto (in this embodiment 4.6 volts) and the collector of an npn type transistor 62. The emitter of the transistor 62 is connected directly to the collector of the transistor 32 and the base is connected through resistor 100 to the positive voltage terminal 41. A bypass capacitor 63 is connected from the base of the transistor 62 to ground.

The circuit illustrated is a Colpitts type oscillator designed to operate on the third overtone of the crystal 20 at approximately an $F_s$ of 50 megahertz (where $F_s$ is the frequency at which the motional branch of the crystal is at series resonance). The crystal 20, capacitor 34, capacitor 33, capacitor 43, voltage variable capacitor 50, capacitor 51, coil 52, coil 13 and coil 14 form the tank circuit of the oscillator with the first and second inductances (coils 13, 14a and 14b) providing the neutralization of the crystal 20 and impedance transformation between the crystal 20 and the tank circuit which operates as a load for the crystal 20. The coils 14a and 14b are effectively in parallel even though the coil 14b is connected in series with the one split capacitor 33 and the series combination is coupled in parallel with the first coil 14a of the second inductance. The DC blocking capacitor 34 can be practically ignored because of its size relative to the remaining components.

In a high frequency oscillator of the type illustrated wherein the coil 14b is omitted, the stability versus frequency adjustment is very poor because there is a tendency for the oscillator to operate at spurious modes when the crystal is warped below or above $F_s$. In an oscillator of this type spurious modes of oscillation may occur when the frequency of the oscillator is varied greater than approximately 3 kHz above $F_s$ and 1.5 kHz below $F_s$. By splitting the second inductance into two coils, 14a and 14b, and connecting them as illustrated, the stability versus frequency adjustment of the oscillator is greatly improved because the coil 14b effectively de-Q's the circuit when the impedance between junctions 31 and 103 is greater than some fixed value, for example 200 ohms, determined by the component sizes. The value of the impedance seen by the crystal is zero ohms at $F_s$, because of series resonance, and increases as the frequency varies in either direction from $F_s$. With the impedance equal to zero the presence of the coil 14b does not appreciably affect the circuit gain and simply operates in conjunction with the coil 14a as a neutralizing and impedance transforming circuit. However, as the oscillator is warped below or above $F_s$ a greater distance the impedance increases until the coil 14b begins to effectively de-Q the circuit. By connecting the coil 14b as described, the oscillator has very good stability over a wide frequency adjust range, for example, in the present embodiment the oscillator is stable for 6 kHz adjustments of the operating frequency above and below $F_s$.

Figure 7:
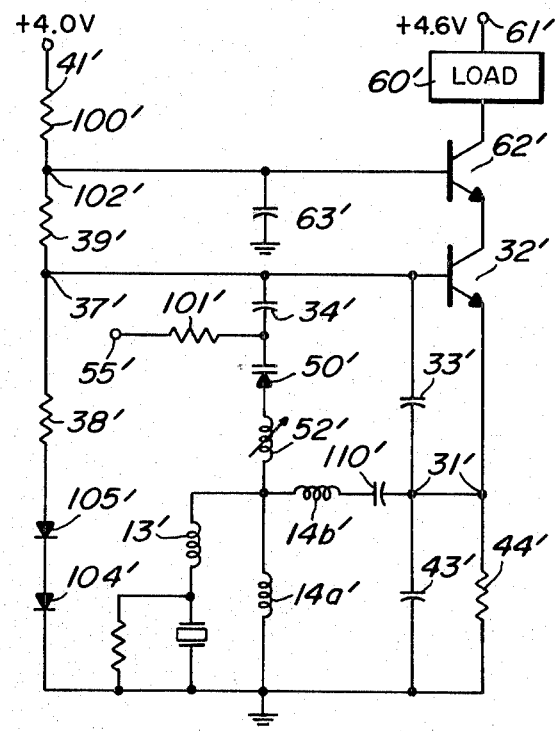
FIG. 7 is a schematic diagram of another embodiment of a high frequency oscillator similar to FIG. 6.

A second embodiment of the oscillator is illustrated in FIG. 7 wherein the position of various components within the tank circuit is altered so that one side of the crystal is grounded. The oscillator of FIG. 7 has all of the components illustrated in FIG. 6 and all of these components operate in a similar fashion, but the numbers designating the components have a prime added to indicate that it is a different embodiment. A small DC blocking capacitor 110' is added between the coil 14b' and the junction 31' to prevent the flow of DC current therebetween.

Figure 8:
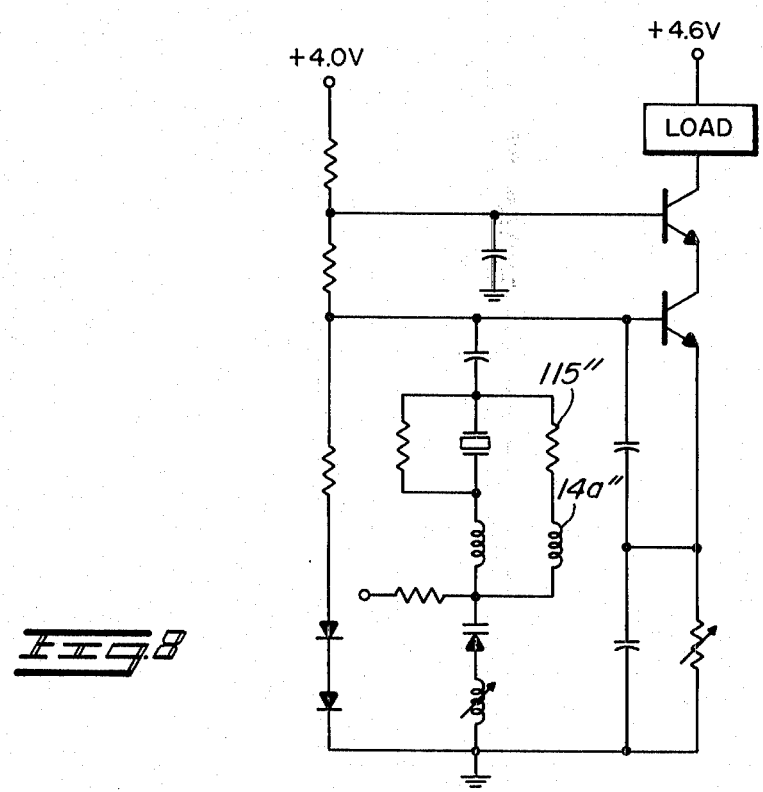
FIG. 8 is a schematic diagram of another embodiment of a high frequency oscillator similar to FIG. 6.

A third embodiment of the oscillator is illustrated in FIG. 8 wherein the various components within the tank circuit are positioned as in FIG. 6 and all of the components operate in a similar fashion, but the numbers designating the components have a double prime added to indicate that it is a different embodiment. In this embodiment the capacitor 51 is eliminated and a resistor 115'' in series with the coil 14a'' is substituted for the coil 14b. Resistor 115'' in series with the coil 14a'' provides sufficient attenuation of spurious modes and, therefore, coil 14b (FIG. 6) can be eliminated.

Typical values for the various components in both of the embodiments illustrated in FIGS. 6 and 7 are listed below.

| Inductances | | Capacitances | |
|---|---|---|---|
| 13 | .50 μh | 33 | 75Pf |
| 14a | .90 | 34 | 1000 |
| 14b | 1.6 | 43 | 75 |
| 52 | 1.0 | 51 | 220 |
| | | 63 | 1000 |
| | | 110' | 1000 |

Varicap 50 - MV109

| Resistors | |
|---|---|
| 30 | 2.7 KΩ |
| 30'' | 4.7 KΩ |
| 38 | 5 K |
| 39 | 10 K |
| 44 | 220 Ω |
| 100 | 10 K |
| 101 | 100 K |
| 115'' | 50 Ω |

Transistors 32 & 62 M9570

Thus, a variable high frequency crystal oscillator is disclosed which has good crystal sensitivity due to the neutralization of $C_o$. Further, the oscillator is variable over a wide range utilizing a commercially available voltage variable capacitor and the oscillator is stable over a relatively wide range of frequency adjustment. If a somewhat narrower range of frequency adjustment is acceptable, a resistor can be substituted for the coil 14b. Further, the specific embodiments and values of the components and frequencies described are simply for exemplary purposes and different operating frequencies will require different components values. While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

I claim:
1. An improved variable, high frequency crystal oscillator comprising:
   a. an oscillator having an electronic tank circuit including a crystal and a pair of capacitors connected in series and coupled to said crystal;
   b. first inductance means coupled in the tank circuit in series with the crystal;
   c. second inductance means coupled in parallel with the crystal and said first inductance means;
   d. third inductance means coupled in series with one of the tank circuit capacitors and the series combination coupled in parallel with said second inductance means;
   e. impedance varying means coupled into the tank circuit for varying the frequency of oscillation thereof; and
   f. the third inductance means further being coupled in series with the other one of the tank circuit capacitors and the series combination coupled in parallel with said impedance varying means.

2. An improved variable, high frequency crystal oscillator as claimed in claim 1 wherein the oscillator is a colpitts type oscillator.

3. An improved variable, high frequency crystal oscillator as claimed in claim 1 wherein the third inductance means is coupled between two relatively low impedance junction points in the tank circuit.

4. An improved variable, high frequency crystal oscillator as claimed in claim 1 wherein the impedance varying means includes a voltage variable capacitor.

5. An improved variable, high frequency crystal oscillator as claimed in claim 2 wherein the colpitts type oscillator includes a transistor having first, second and control electrodes and the one tank circuit capacitor is coupled between the first and control electrodes of said transistor.

6. An improved variable, high frequency crystal oscillator as claimed in claim 2 wherein the colpitts type oscillator includes a transistor having first, second and control electrodes and the one tank circuit capacitor is coupled between the first electrode of said transistor and a reference potential and the other tank circuit capacitor is coupled between the first and control electrodes of said transistor.

7. An improved variable, high frequency crystal oscillator comprising:
   a. an oscillator having an electronic tank circuit including a crystal and a pair of capacitors which are connected in series as a capacitive voltage divider and are series coupled to said crystal, said crystal having a physical capacitance, $C_o$;
   b. first and second inductance means;
   c. means for coupling the first and second inductance means into the tank circuit for neutralizing the physical capacitance, $C_o$, of the crystal and for providing an impedance transformation between the crystal and the tank circuit operating as a load on the crystal; and
   d. impedance varying means coupled into the tank circuit for varying the frequency of oscillation thereof.

8. An improved variable, high frequency crystal oscillator as claimed in claim 7 wherein the first inductance means includes an inductance coupled in series with the crystal.

9. An improved variable, high frequency crystal oscillator as claimed in claim 8 wherein the second inductance means includes an inductance coupled in parallel with the series coupled crystal and the inductance of the first inductance means.

10. An improved variable, high frequency crystal oscillator as claimed in claim 9 wherein the second inductance means includes a second inductance coupled in series with one of the pair of capacitors in the tank circuit and the series combination being coupled in parallel with the other inductance in said second inductance means.

* * * * *